United States Patent [19]

Jeon

[11] Patent Number: 5,838,189
[45] Date of Patent: Nov. 17, 1998

[54] SUBSTRATE VOLTAGE GENERATING CIRCUIT OF SEMICONDUCTOR MEMORY DEVICE

[75] Inventor: Jun-Young Jeon, Seoul, Rep. of Korea

[73] Assignee: Samsung Electronics Co., Ltd., Suwon, Rep. of Korea

[21] Appl. No.: 574,020

[22] Filed: Dec. 18, 1995

[30] Foreign Application Priority Data

Dec. 21, 1994 [KR] Rep. of Korea ................... 1996 35776

[51] Int. Cl.[6] ......................................................... G05F 1/10
[52] U.S. Cl. ............................ 327/537; 327/78; 327/535; 327/525
[58] Field of Search ................................. 327/78, 80, 81, 327/437, 534, 535, 536, 537, 525

[56] References Cited

U.S. PATENT DOCUMENTS

| | | | |
|---|---|---|---|
| 5,039,877 | 8/1991 | Chern | 327/536 |
| 5,266,842 | 11/1993 | Park | 327/534 |
| 5,367,489 | 11/1994 | Park et al. | 327/536 |
| 5,426,334 | 6/1995 | Skovmand | 327/427 |
| 5,448,199 | 9/1995 | Park | 327/546 |
| 5,473,277 | 12/1995 | Furumochi | 327/543 |
| 5,554,953 | 9/1996 | Shibayama et al. | 327/541 |
| 5,572,147 | 11/1996 | Huang et al. | 327/81 |

OTHER PUBLICATIONS

"A Tunable CMOS–DRAM Voltage Limiter With Stabilized Feedback Amplifier," by M. Horiguchi, M. Aoki, J. Etoh, H. Tanaka, S. Ikenaga, K. Itoh, K. Kajigaya, H. Kotani, K. Ohshima and T. Matsumoto; 1990 Symposium on VLSI Circuits, pp. 75–76.

*Primary Examiner*—Terry Cunningham
*Attorney, Agent, or Firm*—Marger, Johnson, McCollom & Stolowitz, P.C.

[57] ABSTRACT

A substrate voltage generating circuitry for a dynamic random access memory (DRAM) generates the substrate voltage using an intermittently enabled charge pump. The value to which the substrate voltage is regulated is adjusted responsive to the static refresh and dynamic refresh characteristics of the memory cells. The adjustment is made in the portion of the substrate voltage generating circuit used for sensing the substrate potential, using fusible links that can be interrupted or cut with a laser beam. Novel circuitry for sensing the substrate potential, which does not load the substrate so as to dissipate charge placed thereon by the charge pump, is used in preferred substrate voltage generating circuitry.

6 Claims, 2 Drawing Sheets

SUBSTRATE VOLTAGE GENERATING CIRCUIT OF SEMICONDUCTOR MEMORY DEVICE

BACKGROUND OF THE INVENTION

1. Field of the Invention

The present invention relates to a substrate voltage generating circuit of semiconductor memory devices and, more particularly, to a substrate voltage generating circuit for adjusting a substrate voltage in accordance with a refresh characteristic of the devices.

2. Description of the Prior Art

Insulated-gate field effect transistors (FETs) using metal-oxide-semiconductor (MOS) construction are known, ones of n-channel type (NMOS FETs) being constructed in p-type substrate or isolation wells, and ones of p-channel type (PMOS FETs) being constructed in n-type substrate or isolation wells. In a dynamic random access memory (hereinafter referred to as "DRAM") constructed on a substrate of p-type semiconductive material, capacitance is exhibited between the substrate and the bus connections at the lowest voltage to which the source electrodes of NMOS FETs generally are connected, which lowest voltage is conventionally designated as "ground" potential. A portion of this capacitance is attributable to the pn junctions formed between the p-type substrate and the n-type source diffusions of the NMOS FETS. The common practice is to use a substrate voltage generating circuit for generating a negative voltage, as referred to that "ground" potential, for application to the substrate of p-type semiconductive material. When the negative voltage generated in the substrate voltage generating circuit is applied to the substrate in the DRAM, the fluctuation of the threshold voltage of an NMOS FET caused by the body effect of the transistor can be minimized. Further, the application of the negative voltage to the substrate makes it possible to heighten a punch-through voltage and to reduce a junction capacitance thereby to improve overall operation speed of the device. At the same time, when a substrate voltage VBB is connected with a ground voltage terminal, an amount of a subthreshold current can be reduced and a forward-bias phenomenon caused due to undershoot of an input voltage can be suppressed thereby to protect the memory device. As noted from the above, the application of the negative voltage to the substrate of the DRAM ensures good performance of the memory device.

FIG. 1 is a circuit diagram illustrating the structure of the substrate voltage generating circuit used in a conventional DRAM. In FIG. 1, an oscillator 10 is enabled by an oscillating control signal φEN being received and generates a square wave oscillating signal. A driver 20 connected to the output terminal of the oscillator 10 amplifies the oscillating signal and supplies the amplified signal to a charge pump 30.

Then, the charge pump 30 is enabled in a period during which the oscillating signal is generated, and charges and pumps charge between the substrate and the ground bus connections, thereby generating the substrate voltage VBB having the negative voltage. The substrate voltage VBB is supplied as the negative voltage to the substrate. In addition, the substrate voltage VBB is applied to a voltage detector 40 which detects the substrate voltage VBB and, if the detected substrate voltage VBB rises above a constant reference voltage, generates an oscillating control signal φEN. Accordingly, if the substrate voltage VBB does not maintain a constant negative voltage level, the voltage detector 40 generates the oscillating control signal φEN for adjusting the substrate voltage VBB.

The voltage detector 40 is composed of a p-channel metal-oxide-semiconductor PMOS field-effect transistor (FET) 111 connected between a supply voltage VCC and a connection node 102 and having a gate electrode connected to the ground voltage VSS, an NMOS transistor 112 having a drain electrode connected to the connection node 102 and a gate electrode connected to a supply voltage VCC, a PMOS transistor 113 connected between a source electrode of the NMOS transistor 112 and an output node 101 and having a gate electrode connected to the output node 101, and a buffer amplifier 114 connected between the connection node 102 and the oscillator 10. The buffer amplifier 114 should have sufficient gain that its output signal is in one of two states depending on whether its input signal voltage is above or below a toggle point voltage. The buffer amplifier 114 can, for example, comprise a cascade connection of an even number of logic inverters, each of complementary-conductivity metal-oxide-semiconductor (CMOS) construction, receiving VCC as operating potential and having an input toggle point voltage of VCC/2.

In the FIG. 1 substrate voltage generating circuit the MOS transistors 111–113 function as a sensing means for developing a sensing voltage indicative of the level of the substrate voltage VBB, and the buffer amplifier 114 functions as a means for detecting whether that sensing voltage is more positive or more negative than a toggle point voltage, with the its output signal being in one of two logic states indicative of which condition obtains. In the operation of the sensing means, the PMOS transistor 111 is turned ON because its gate electrode is connected to the ground voltage VSS, the NMOS transistor 112 is turned ON because its gate electrode is connected to the supply voltage VCC, and the PMOS transistor 113 is turned ON because its gate electrode is connected to the substrate voltage VBB. Therefore, the MOS transistors 111–113 are in turn-ON states. A voltage is generated in the connection node 102 as determined by the potential dividing action among the channel resistances of the MOS transistors 111–113, which channel resistances are determined by the respective channel dimensions of these transistors. Thus, the buffer amplifier 114 is toggled in accordance with the sensing voltage level generated at the connection node 102 and thereby determines the logic state of the oscillating control signal φEN.

That is, if the substrate voltage VBB is raised to be higher than a preset voltage, the voltage level detected at the connection node 102 becomes higher than the toggle point voltage level of the buffer amplifier 114. The oscillating control signal φEN goes high to enable oscillation by the oscillator 10. The charge pump 30 is accordingly driven by the driver 20 to charge the substrate to a more negative substrate voltage VBB. However, if the substrate voltage VBB is at least as negative as the prescribed voltage, the voltage level detected at the connection node 102 becomes lower than the toggle point voltage level of the buffer amplifier 114. The oscillating control signal φEN goes low, and oscillation by the oscillator 10 is disabled. Accordingly, the channel dimensions of the MOS transistors 111–113 are selected dependent upon the levels of the toggle voltage of the buffer amplifier 114 and the substrate voltage VBB level. In other words, in the case where the substrate voltage VBB is generated with the prescribed level, the channel dimensions of the MOS transistors 111–113 are selected so that the voltage level detected at the connection node 102 is just below the toggle point voltage level of the buffer amplifier 114. Then, the voltage detector 40 generates the oscillating control signal φEN in order to bring the substrate voltage VBB down to the prescribed negative voltage and maintain the substrate voltage VBB at the prescribed negative voltage. Usually, the channel dimensions are chosen so that the offset voltage of the diode connected FET 113 approximates the desired substrate voltage VBB and so that potential dividing action is primarily between relatively high channel resistances of the PMOS FET 111 and NMOS FET 112. Arranging for potential dividing action to be primarily between relatively high channel resistances of the PMOS FET 111 and NMOS FET 112 compensates somewhat for process variation in the input signal toggle point of the buffer amplifier 114, supposing it to use a CMOS inverter as an input stage.

A variant of the voltage detector 40 known in the art replaces the diode-connected PMOS FET 113 with a diode-connected NMOS FET with its source electrode connected to the substrate. Another variant of the voltage detector 40 known in the art connects the gate of NMOS FET 112 to the ground voltage VSS instead of the voltage VCC. The voltage scaling network for substrate potential, used to supply input voltage to the buffer amplifier, is no longer of the nature of a potential divider but rather functions as a common-gate amplifier.

A known problem with the voltage detector 40 and these variants is that the channels of the FETs 111–113 provide a conduction path from the VCC bus to the substrate that tends to pull the substrate positive in potential, so the charge pump 30 consumes appreciable power to counteract this tendency. Normally, to try to minimize this problem, the channel dimensions of the FETs 111–113 those of are made so as to keep the resistances of their channels high when conductive. This is particularly so of FETs 111 and 112, which provide most of the potential-divider function.

In the DRAM which restores data stored in the memory cell by performing a refresh operation, the static refresh and dynamic refresh characteristics of the memory cell determine the production yield of the memory device. The static refresh characteristic is associated with a junction leakage current of the storage node of the memory cell. In other words, if the negative voltage applied to the substrate is lowered, the inverse voltage applied to the junction of the storage node is accordingly lowered, so that the junction leakage current can be reduced and the static refresh characteristic can be improved. On the other hand, the dynamic refresh characteristic is associated with isolation of the memory cells adjacent to each other. In other words, if the negative voltage applied to the substrate is lowered, the potential barrier between the storage nodes of the memory cells is accordingly raised, so that an isolation characteristic can be improved. Moreover, the semiconductor memory device embodies its own function by the combination of numerous logics. Accordingly, when fabricating the memory device, a great number of production processes can be implemented. At this time, the logics may respectively have features different from each other because of defects generated during the production processes. However, in the case of using the voltage detector 40 having the structure of FIG. 1, since the channel dimensions of the MOS FETs 111–113 have been fixedly determined, the voltage detector 40 generates the constant negative voltage irrespective of the different fabricating process and the refresh characteristic. As a result, there exists a problem that the production yield of the memory device is reduced because of inability to adjust the negative substrate bias during manufacturing of the DRAM.

Fusible links that can be interrupted or cut with a laser beam have been previously used for modifying various integrated-circuit configurations during integrated-circuit manufacturing.

SUMMARY OF THE INVENTION

The invention in a first of its aspects is embodied in a substrate voltage generating circuit wherein the substrate voltage is generated using an intermittently enabled charge pumper, and wherein the value to which the substrate voltage is regulated can be adjusted using fusible links that can be interrupted or cut with a laser beam.

The invention in a second of its aspects is embodied in a substrate voltage generating circuit wherein the substrate voltage is generated using an intermittently enabled charge pumper, and wherein the substrate voltage is sensed for regulation by circuitry that does not load the substrate, so as to dissipate charge placed thereon by the charge pumper.

Preferred substrate voltage generating circuits embody both these first and second aspects of the invention.

BRIEF DESCRIPTION OF THE DRAWING

This invention may be better understood and its object will become apparent to those skilled in the art by reference to the accompanying drawings as follows.

Figure 1:
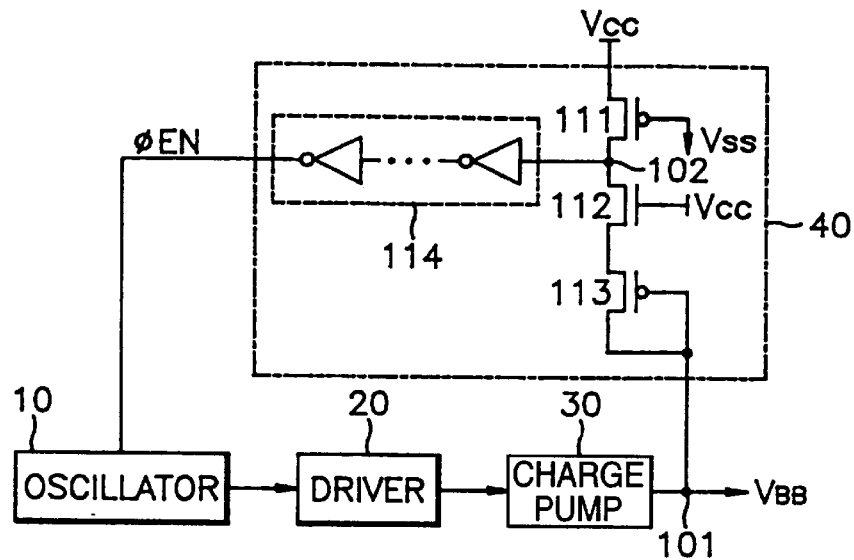
FIG. 1 is a circuit diagram showing the construction of a substrate voltage generating circuit in a conventional semiconductor memory device.

In the drawing those fusible-link shunt connections that can be cut by laser beam during the course of integrated circuit manufacture are depicted by the symbol sometimes used for fuses, a wavy through connection surrounded by a circle.

DESCRIPTION OF THE PREFERRED EMBODIMENTS

The oscillator 10, the driver 20, and the charge pumper 30 in the substrate voltage generating circuit of the semiconductor memory device according to the present invention have the same structure and operation as those shown in FIG. 1.

Figure 2:
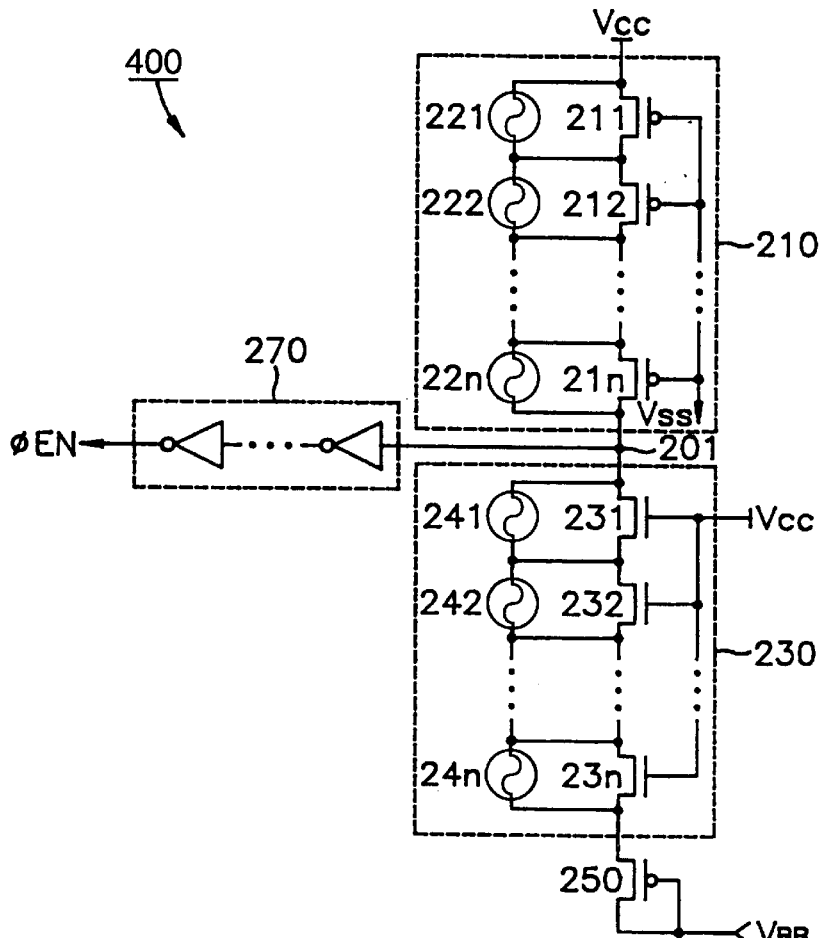
FIG. 2 is a circuit diagram showing a voltage detector in a substrate voltage generating circuit embodying the invention.

FIG. 2 is a circuit diagram which in addition to the oscillator 10, the driver 20, and the charge pump 30 shows a voltage detector 400 in a substrate voltage generating circuit that is a first embodiment of the present invention. The sensing voltage at a connection node 201 is determined by a potential divider formed by a first adjustable conductance element 210, a second adjustable conductance element 230, and the conductance of the channel of a diode-connected PMOS transistor 250 with its drain and gate electrodes connected for receiving the substrate voltage VBB. A buffer amplifier 270 composed of a cascade connection of an even number of inverters determines, in accordance with the level of the voltage at the node 201, the logic state of the oscillating control signal φEN supplied to the oscillator 10.

The first adjustable conductance element 210 includes PMOS transistors 211–21n, having respective channels connected serially between the supply voltage VCC and the connection node 201, and having respective gate electrodes connected to the ground voltage VSS for conditioning their channels for conduction. The first adjustable conductance element 210 further includes shunt connections 221–22n connected in parallel with respective ones of the channels of the PMOS transistors 211–21n. These shunt connections are fusible links, such that during integrated-circuit manufacturing they can be interrupted or cut using a laser beam. Typically, fusible links are formed of a metal that can be vaporized by the laser beam and are formed in the top metal layer of the integrated-circuit construction. If the shunt connections 221–22n are cut, the voltage at the node 201 is lowered in response to the increment(s) of channel resistance of the PMOS transistors 211–21n corresponding to the number of the cut shunt connections, which enables the substrate voltage VBB to be raised to less negative voltage.

A second adjustable conductance element 230 includes NMOS transistors 231–23n having respective channels connected serially between the connection node 201 and the source electrode of the PMOS transistor 250, and having respective gate electrodes connected to the supply voltage VCC for conditioning their channels for conduction. The second adjustable conductance element 230 further includes shunt connections 241–24n connected in parallel with respective ones of the channels of the NMOS transistors 231–23n. These shunt connections are fusible links, such that during integrated-circuit manufacturing they can be interrupted or cut using a laser beam. In order to secure regulation of the substrate voltage VBB, at least one of the shunt connections 221–22n must be cut. Then, if the shunt connections 241–24n are cut, the voltage at the node 201 is raised in response to the increment(s) of channel resistance of the NMOS transistors 231–23n corresponding to the number of the cut shunt connections, which enables the substrate voltage VBB to be lowered to more negative voltage.

Figure 3:
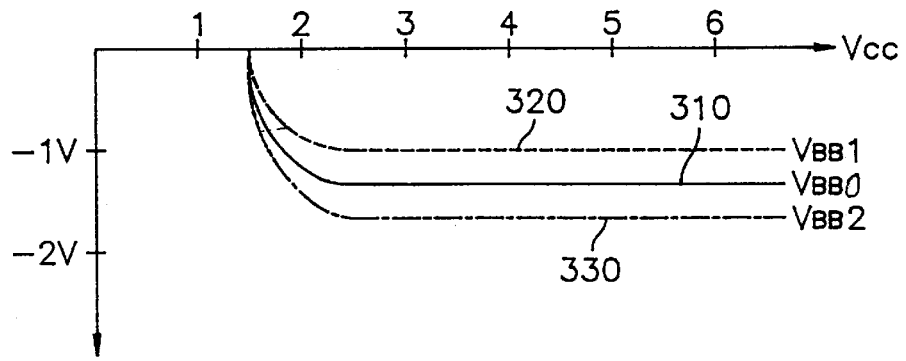
FIG. 3 is a graph showing a characteristic of the substrate voltage adjustments carried out using the FIG. 2 voltage detector.

FIG. 3 shows how the characteristic of the substrate voltage VBB can be adjusted by cutting selected shunt connections in the voltage detector 400 as shown in FIG. 2. As previously noted, at least one of the shunt connections 221–22n must be cut in order to secure regulation of the substrate voltage VBB. Otherwise, the voltage at the node 201 cannot be reduced from VCC, so that the logic state of the oscillating control signal φEN that the buffer amplifier supplies to the oscillator 10 can be switched low, to stop the supply of oscillations from the oscillator 10 and stop the pumping of charge to the substrate by the charge pump 30.

Supposing an appreciable number (but not all) of the shunt connections 221–22n of the first adjustable conductance element 210 are cut and that an appreciable number (but not all) of the shunt connections 241–24n of the second adjustable conductance element 230 are cut, the substrate voltage will be regulated to a value VBB0 per the operating characteristic 310. When the substrate voltage exceeds (i. e., is less negative than) the value VBB0, a reference sensing voltage generated at the node 201 will increase to be more positive than the toggle point voltage for the buffer amplifier 270. Responsive to the reference sensing voltage generated at the node 201 being more positive than the buffer amplifier 270 toggle point voltage, the logic state of the buffer amplifier 270 output signal φEN is high, conditioning the oscillator 10 to generate oscillations that cause the charge pump 30 to pump charge from the substrate to restore the substrate voltage to the value VBB0 so the reference sensing voltage at the node 201 will no longer be more positive than the toggle point voltage for the buffer amplifier 270.

If further ones of the shunt connections 221–22n are cut, the current flowing from the supply voltage VCC connection to the substrate flows through shunt connections not being cut and the channels of PMOS FETs previously shunted by the cut shunt connections. Accordingly, if further ones of the shunt connections 221–22n are cut, the resistance of the first adjustable conductance element 210 is augmented by the channel resistances of the PMOS FETs 211–21n previously shunted by the further cut ones of the shunt connections 221–22n. The increase in resistance in the path from the supply voltage VCC connection to the substrate tends to reduce the current therethrough. However, since the same current flows through the channels of all of those of the FETs 211–21n and 231–23n that do not have their channels shunted there is still an increase in the resistance of the first adjustable conductance element 210 vis-a-vis the resistance of the second adjustable conductance element 230. The channel resistances of the PMOS FETs 211–21n previously shunted by the further cut ones of the shunt connections 221–22n accordingly change the voltage division ratio to cause at the node 201 a first sensing voltage which (as referred to voltage VCC) is a larger fraction of the voltage VBB–VCC than the reference sensing voltage was. In order for this first sensing voltage to be more positive than the buffer amplifier 270 toggle point voltage, so that the logic state of the buffer amplifier 270 output signal φEN will be switched high to condition the oscillator 10 to generate oscillations that cause the charge pump 30 to pump charge from the substrate, the substrate potential will have to exceed (i. e., be less negative than) the value VBB1. Accordingly, per the operating characteristic 320, the substrate voltage will be regulated to a value VBB1 which is less negative than the value VBB0.

Alternatively suppose, instead of further ones of the shunt connections 221–22n being cut to increase the resistance of the first adjustable conductance element 210, further ones of the shunt connections 241–24n are cut to increase the resistance of the second adjustable conductance element 230. Then the current flowing from the supply voltage VCC connection to the substrate flows through shunt connections not being cut and the channels of NMOS FETs previously shunted by the severed shunt connections. Accordingly, if further ones of the shunt connections 241–24n are cut, the resistance of the second adjustable conductance element 230 is augmented by the channel resistances of the NMOS FETs 231–23n previously shunted by the further cut ones of the shunt connections 241–24n. The increase in resistance in the path from the supply voltage VCC connection to the substrate tends to reduce the current therethrough. However, since the same current flows through the channels of all of those of the FETs 211–21n and 231–23n that do not have their channels shunted, there is still an increase in the resistance of the second adjustable conductance element 230 vis-a-vis the resistance of the first adjustable conductance element 210. The channel resistances of the NMOS FETs 231–23n previously shunted by the further cut ones of the shunt connections 241–24n accordingly change the voltage division ratio to cause at the node 201 a second sensing voltage which (as referred to voltage VCC) is a smaller fraction of the voltage VBB–VCC than the reference sensing voltage was.

In order for this second sensing voltage to be more positive than the buffer amplifier 270 toggle point voltage, so that the logic state of the buffer amplifier 270 output signal φEN will be switched high to condition the oscillator 10 to generate oscillations that cause the charge pump 30 to pump charge from the substrate, the substrate potential will have to exceed (i. e., be less negative than) the value VBB2. Accordingly, per the operating characteristic 330, the substrate voltage will be regulated to a value VBB1 which is more negative than the value VBB0.

As the number of selectively shunted transistors in each of the first and second adjustable conductance elements 210 and 230 is increased, the precision of the regulation of the substrate voltage VBB can be increased. The precision of the regulation of the substrate voltage VBB can be further increased by using different channel dimensions in each of the transistors within each of the first and second adjustable conductance elements 210 and 230, rather than the transistors within each of the first and second adjustable conductance elements 210 and 230 having identical channel dimensions.

In the structure of FIG. 2, each of the shunt connections 221–22n and 241–24n selectively is cut using a laser beam or is not cut. Also, the shunt connections 221–22n and 241–24n that are cut by the laser beam are selected in accordance with the refresh characteristic. The first and second adjustable conductance elements 210 and 230 can be constructed with the same number of MOS transistors and shunt connections as each other or, alternatively, may be designed with different numbers of MOS transistors and shunt connections than the other. Moreover, the respective MOS transistors within each of the first and second adjustable conductance elements 210 and 230 may be constructed with the same channel dimensions as each other or, alternatively, may be constructed with different channel dimensions in prescribed ratios with each other.

The FIG. 2 structure will suggest to one skilled in the art of integrated circuit design other embodiments of the invention that are variants of the FIG. 2 structure. For example, the order of serial connection of the diode-connected PMOS FET 250 and the second adjustable conductance element 230 may be reversed. The diode-connected PMOS FET 250 may be replaced by a diode-connected NMOS FET. The diode-connected PMOS FET 250 may be replaced by a direct impedance-free connection of the source electrode of the NMOS FET 23n to the substrate; and the drain electrode of the NMOS FET 231 may be connected to the node 201 not directly, but instead through the channel of another NMOS FET connected as a grounded-gate amplifier. To reduce the number of shunt connections that need to be cut over the course of manufacture, the channel of one of the FETs 211–21n may not have a shunt connection in parallel with it, and the channel of one of the FETs 231–23n may not have a shunt connection in parallel with it.

Since the voltage detector 400 of FIG. 2 is structured to connect the first adjustable conductance element 210, the second adjustable conductance element 230, and the diode-connected PMOS FET 250 between the supply voltage VCC and substrate voltage VBB, a current path between the supply voltage VCC and substrate voltage VBB continuously exists that tends to discharge the substrate capacitance, requiring it to have to be frequently re-charged by the charge pumper 30 and so increasing the power consumption.

Figure 4:
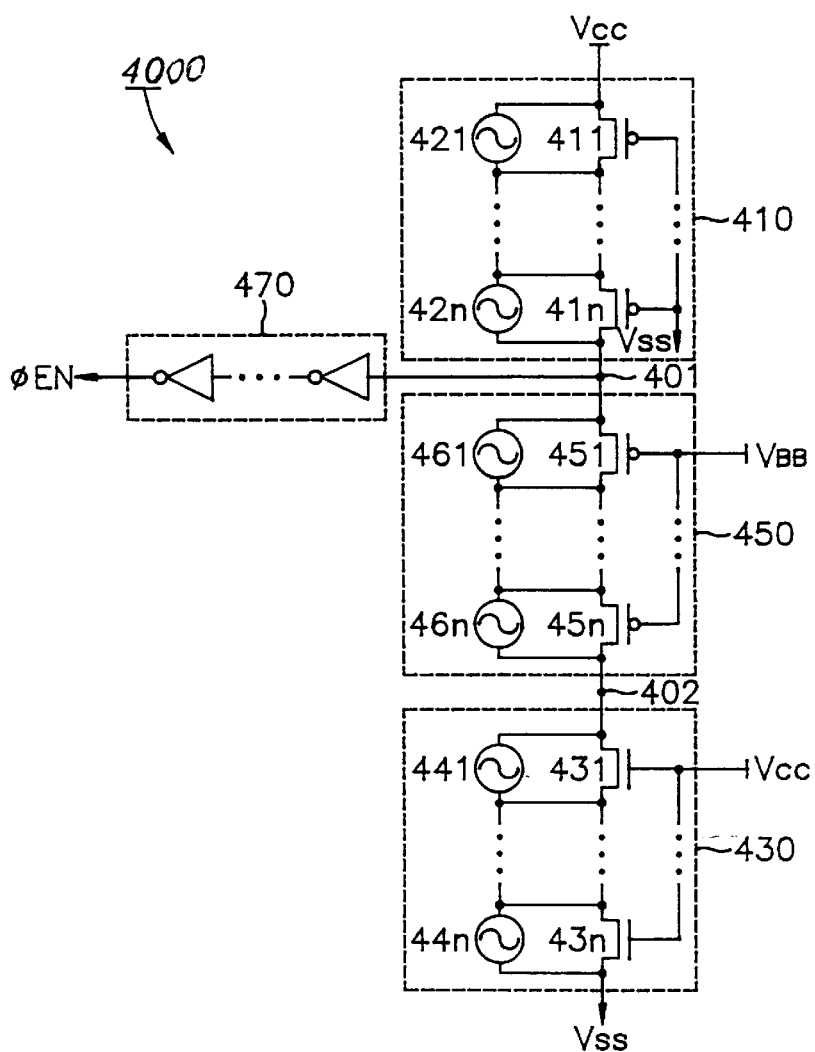
FIG. 4 is a circuit diagram showing a voltage detector in another substrate voltage generating circuit embodying the invention in further of its aspects.

FIG. 4 is a circuit diagram showing another substrate voltage generating circuit embodying the present invention that replaces the voltage detector 400 of FIG. 2 with a voltage detector 4000 that avoids this problem in accordance with a further aspect of the invention. In addition to the voltage detector 4000, the FIG. 4 substrate voltage generating circuit includes the oscillator 10, the driver 20, and the charge pump 30 that have the same structure and operation as those shown in FIG. 1. The voltage at a first connection node 401 is determined by a potential divider formed by a first adjustable conductance element 410, a second adjustable conductance element 430, and a third adjustable conductance element 450. A buffer amplifier 470 composed of a cascade connection of an even number of inverters determines, in accordance with the level of the voltage at the node 401, the logic state of the oscillating control signal φEN supplied to the oscillator 10. The series connection of the first, second, and third adjustable conductance elements 410, 430 and 450 is between the VCC and VSS supply busses, rather than between the VCC supply bus and the substrate, so current flow through this series connection does not discharge the substrate capacitance.

The third adjustable conductance element 450 includes PMOS transistors 451–45n, having respective channels connected serially between the first connection node 401 and a second connection node 402, and having respective gate electrodes connected to the substrate for conditioning their channels for conduction. The third adjustable conductance element 430 further includes shunt connections 461–46n connected in parallel with respective ones of the channels of the PMOS transistors 451–45n. These shunt connections are fusible links, such that during integrated-circuit manufacturing they can be interrupted or cut using a laser beam. If all the shunt connections 461–46n are intact, there is no mechanism for coupling the substrate potential VBB to the first connection node 401 at the input of the buffer amplifier 470, so the substrate voltage VBB is not regulated. So at least one of the shunt connections 461–46n is cut during DRAM manufacture. Some degree of source-follower action is exhibited by each of the PMOS transistors 451–45n that has the shunt connection paralleling its channel cut, so that transistor tends to reproduce at its source electrode the VBB variation applied to its gate electrode. This provides the mechanism for coupling the substrate potential VBB to the first connection node 401 at the input of the buffer amplifier 470.

The first adjustable conductance element 410 includes PMOS transistors 411–41n, having respective channels connected serially between the supply voltage VCC and the first connection node 401, and having respective gate electrodes connected to the ground voltage VSS for conditioning their channels for conduction. The first adjustable conductance element 410 further includes shunt connections 421–42n connected in parallel with respective ones of the channels of the PMOS transistors 411–41n. These shunt connections are fusible links, such that during integrated-circuit manufacturing they can be interrupted or cut using a laser beam. If the shunt connections 421–42n are cut, the voltage at the node 401 is lowered in response to the increment(s) of channel resistance of the PMOS transistors 411–41n corresponding to the number of the cut shunt connections, which enables the substrate voltage VBB to be raised to less negative voltage.

The second adjustable conductance element 430 includes NMOS transistors 431–43n having respective channels connected serially between the connection node 402 and the ground potential VSS, and having respective gate electrodes connected to the supply voltage VCC for conditioning their channels for conduction. The second adjustable conductance element 430 further includes shunt connections 441–44n connected in parallel with respective ones of the channels of the NMOS transistors 431–43n. These shunt connections are fusible links, such that during integrated-circuit manufacturing they can be interrupted or cut using a laser beam. If the shunt connections 441–44n are cut, the voltages at the nodes 401 and 402 are raised responsive to the increment(s) of channel resistance of the NMOS transistors 431–43n corresponding to the number of the cut shunt connections, which enables the substrate voltage VBB to be lowered to more negative voltage. In contrast to the effect of increase in the resistance of the second adjustable conductance element 230 in the FIG. 2 circuit, this increase in the resistance of the second adjustable conductance element 430 does not result in increased potential division leading to reduction of VBB variation as applied to the node 401. The source-follower action exhibited by each of the PMOS transistors 451–45n that has the shunt connection paralleling its channel cut controls the application of VBB variation to the node 401. Change in the resistance of the second adjustable conductance element 230 has its primary effect upon the direct biasing of the node 401 as determined by potential division of VCC, not on the gain of VBB variation applied to the node 401.

The number of shunt connections 461–46n that are cut in the third adjustable conductance element 450 also affects the direct biasing of the node 401, owing to the effect of the channel resistances of the transistors 451–45n that are no longer shunted upon potential division of VCC. The voltage at the node 401 is raised responsive to the increment(s) of channel resistance of the PMOS transistors 451–45n corresponding to the number of the cut shunt connections, which enables the substrate voltage VBB to be lowered to more negative voltage. Further, the number of shunt connections 461–46n that are cut in the third adjustable conductance element 450 affects the source impedance exhibited by the source follower action of the unshunted PMOS transistors 451–45n so that the level to which the substrate potential is regulated can be affected with another degree of control that can be of subtler nature.

In the structure of FIG. 4, each of the shunt connections 421–42n, 441–44n and 461–46n selectively is cut using a laser beam or is not cut. Also, the shunt connections 421–42n, 441–44n and 461–46n that are cut by the laser beam are selected in accordance with the refresh characteristic. The first, second, and third adjustable conductance elements 410, 430 and 450 can be constructed with the same number of MOS transistors and shunt connections as each other or, alternatively, may be designed with different numbers of MOS transistors and shunt connections than either or both of the others of those adjustable conductance elements. Moreover, the respective MOS transistors within each of the first, second, and third adjustable conductance elements 410, 430 and 450 may be constructed with the same channel dimensions as each other or, alternatively, may be constructed with different channel dimensions in prescribed ratios with each other. It is advantageous to construct the PMOS FETs in the third adjustable conductance element 450 so that their drain characteristics as a function of source-to-gate voltage differ. Ion implantation may be used to affect semiconductor doping in addition to using differences in transistor dimensions to achieve these differences in drain characteristics. The serial arrangement of the second and third adjustable conductance elements 430 and 450 can be opposite to that shown, but VBB variation will be subjected to potential division between the first adjustable conductance element 410 and the second adjustable conductance element 420 before application to the node 401. To reduce the number of shunt connections that need to be cut over the course of manufacture, the channel of one of the FETs 411–41n may not have a shunt connection in parallel with it, the channel of one of the FETs 431–43n may not have a shunt connection in parallel with it, and the channel of one of the FETs 451–45n may not have a shunt connection in parallel with it.

While the foregoing description of the invention is cast in terms of field-effect transistor technology using p-type substrates where substrate biasing is negative, which is the current dominant technology for silicon integrated circuits, the invention also has equal application to field-effect transistor technology using n-type substrates where substrate biasing is positive. In the claims which follow, their scope is to be construed to include within their ambit substrate voltage generating circuits in which severable connections currently exist or existed but currently are severed or cut.

What is claimed is:

1. A substrate voltage generating circuit for a semiconductor memory device provided with first and second operating supply terminals for application of direct operating supply voltage therebetween to cause respective potentials at said first and second operating supply terminals which said respective potentials differ from each other, said semiconductor memory device constructed in integrated-circuit form on a substrate of semiconductive material having capacitance with respect to said first operating supply terminal, said substrate voltage generating circuit comprising:

an oscillator for selectively generating an oscillating signal, the generation of said oscillating signal being enabled or disabled in accordance with respective first and second states of an oscillating control signal;

a charge pump responsive to said oscillating signal for charge-pumping said substrate to a potential that differs from potential at said first operating supply terminal in opposite sense of polarity that the potential at said second operating supply terminal differs from potential at said first operating supply terminal; and a detector for detecting whether or not the potential of said substrate differs from the potential at said first operating supply terminal by less than a prescribed substrate voltage value in order to generate said first and second states of said oscillating control signal, respectively, said detector comprising:

a plurality of insulated-gate field effect transistors, having respective channels in serial connection between said second and first operating supply terminals, having respective source and drain electrodes at opposite ends of their respective channels, and having respective gate electrodes connected for conditioning said insulated-gate field effect transistors to be conductive:

a respective severable connection between the drain and source electrodes of at least one of said insulated-gate field effect transistors; and amplifier circuitry having an input connection from the connection of the channels of two of said insulated-gate field effect transistors, and having an output connection for supplying the first state of said oscillating control signal when voltage at said input connection differs from the potential at said second operating supply terminal by more than a toggle voltage value and for supplying the second state of said oscillating control signal when voltage at said amplifier circuitry input connection does not differ from the potential at said second operating supply terminal by more than said toggle voltage value, said toggle value voltage differing from the potential at said second operating supply terminal by less than the potential at said first operating supply terminal; wherein the potential of said substrate is applied to a gate electrode of a first of said insulated-gate field effect transistors with the channel thereof in a portion of said serial connection between said second and first operating operating supply terminals, which portion is between said amplifier circuitry input connection and said first operating supply terminal, which said first insulated-gate field effect transistor is of a first conductivity type, wherein said plurality of insulated-gate field effect transistors includes a first smaller plurality of said insulated-gate field effect transistors of said first conductivity type connected as a first adjustable conductance element with their channels connected between said second operating supply terminal and said amplifier circuitry input connection so the source electrode of each of said first smaller plurality of said insulated-gate field effect transistors is closer to said second operating voltage terminal than the drain electrode thereof, with their gate electrodes biased from said first operating supply terminal, and with said respective severable connection between the drain and source electrodes of at least one of said insulated-gate field effect transistors in said first smaller plurality.

2. A substrate voltage generating circuit as set forth in claim 1; wherein, besides said first insulated-gate field effect transistor of said first conductivity type, and besides said first smaller plurality of said insulated-gate field effect transistors of said first conductivity type connected as said first adjustable conductance element, said plurality of insulated-gate field effect transistors includes a second smaller plurality of said insulated-gate field effect transistors of a second conductivity type connected as a second adjustable conductance element, with their channels connected between said first operating supply terminal and the drain electrode of at least said first insulated-gate field effect transistor of said first conductivity type, so the source electrode of each of said second smaller plurality of said insulated-gate field effect transistors is closer to said first operating voltage terminal than the drain electrode thereof, and with said respective severable connection between the drain and source electrodes of at least one of said insulated-gate field effect transistors in said second smaller plurality, said first and second conductivity types being complementary to each other.

3. A substrate voltage generating circuit as set forth in claim 2, wherein the gate electrodes of said second smaller plurality of said insulated-gate field effect transistors of said second conductivity type connected as said second adjustable conductance element are biased from said second operating supply terminal.

4. A substrate voltage generating circuit as set forth in claim 2, wherein each of said plurality of insulated-gate field effect transistors other than said first insulated-gate field effect transistor that is not included in either of said first and second smaller pluralities of insulated-gate field effect transistors is of said first conductivity type, has the potential of said substrate applied to its gate electrode and has a respective said severable connection between its drain and source electrodes.

5. A substrate voltage generating circuit as set forth in claim 1, wherein said plurality of insulated-gate field effect transistors includes a second smaller plurality of said insulated-gate field effect transistors of a second conductivity type connected as an adjustable conductance element with their channels connected between said first operating supply terminal and the drain electrode of at least said first insulated-gate field effect transistor of said first conductivity type, so the source electrode of each of said second smaller plurality of said insulated-gate field effect transistors is closer to said first operating voltage terminal than the drain electrode thereof, and with said respective severable connection between the drain and source electrodes of at least one of said insulated-gate field effect transistors in said second smaller plurality.

6. A substrate voltage generating circuit as set forth in claim 5, wherein the gate electrodes of said smaller plurality of said insulated-gate field effect transistors of said second conductivity type connected as said adjustable conductance element are biased from said second operating supply terminal.

* * * * *

UNITED STATES PATENT AND TRADEMARK OFFICE
CERTIFICATE OF CORRECTION

PATENT NO. : 5,838,189
DATED : November 17, 1998
INVENTOR(S) : Jeon

It is certified that error appears in the above-identified patent and that said Letters Patent is hereby corrected as shown below:

Column 4,
Lines 4, 12, 14 and 44, change "charge pumper 30" should read -- charge pump 30 --.

Column 7,
Line 56, "charge pumper 30" should read -- charge pump 30 --.

Signed and Sealed this

Twentieth Day of August, 2002

Attest:

JAMES E. ROGAN
Attesting Officer　　Director of the United States Patent and Trademark Office